United States Patent
Wang et al.

(10) Patent No.: US 10,600,851 B2
(45) Date of Patent: Mar. 24, 2020

(54) ORGANIC LIGHT-EMITTING DISPLAY PANEL AND ORGANIC LIGHT-EMITTING DISPLAY DEVICE

(71) Applicant: Shanghai Tianma AM-OLED Co., Ltd., Shanghai (CN)

(72) Inventors: Xiangcheng Wang, Shanghai (CN); Jinghua Niu, Shanghai (CN); Ding Li, Shanghai (CN); Ping An, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/059,248

(22) Filed: Aug. 9, 2018

(65) Prior Publication Data

US 2019/0371870 A1 Dec. 5, 2019

(30) Foreign Application Priority Data

May 29, 2018 (CN) .......................... 2018 1 0530411

(51) Int. Cl.
| | |
|---|---|
| *H01L 27/32* | (2006.01) |
| *G06K 9/00* | (2006.01) |
| *H01L 51/52* | (2006.01) |
| *H01L 27/12* | (2006.01) |

(52) U.S. Cl.
CPC ........ *H01L 27/3246* (2013.01); *G06K 9/0004* (2013.01); *H01L 27/124* (2013.01); *H01L 27/3272* (2013.01); *H01L 51/5203* (2013.01); *H01L 27/323* (2013.01)

(58) Field of Classification Search
CPC .. G09G 3/3233; G09G 3/3258; G09G 3/3208; G06K 9/0002; G06K 9/00013; G06K 9/0004; G06K 9/00006
See application file for complete search history.

(56) References Cited

U.S. PATENT DOCUMENTS

| | | | | |
|---|---|---|---|---|
| 9,489,092 | B2* | 11/2016 | Kim | ...................... G06F 3/0412 |
| 2018/0052359 | A1* | 2/2018 | Umemoto | ............. G02F 1/1333 |
| 2018/0069068 | A1* | 3/2018 | Ka | ........................ H01L 27/3262 |
| 2018/0165533 | A1* | 6/2018 | Cho | ........................ G06F 3/0412 |

FOREIGN PATENT DOCUMENTS

CN 106055162 A 10/2016

* cited by examiner

*Primary Examiner* — Koosha Sharifi-Tafreshi
(74) *Attorney, Agent, or Firm* — Anova Law Group PLLC (57) ABSTRACT

An organic light-emitting display panel includes an array substrate including a plurality of driving elements; a plurality of organic light-emitting components corresponding to the plurality of driving elements; and a plurality of fingerprint identification units, where each organic light-emitting component includes an anode and a cathode, and light emitted by the organic light-emitting component emits away from the array substrate, a pixel defining layer is disposed between adjacent organic lighting emitting components, a fingerprint identification unit is disposed at a non-display area between organic light-emitting components and on a side of the pixel defining layer away from the array substrate, and a periphery of the fingerprint identification unit is provided with a light-shielding layer, and the light-shielding layer blocks the fingerprint identification unit from illumination by the light emitted by the organic light-emitting component.

18 Claims, 5 Drawing Sheets

ORGANIC LIGHT-EMITTING DISPLAY PANEL AND ORGANIC LIGHT-EMITTING DISPLAY DEVICE

CROSS-REFERENCES TO RELATED APPLICATIONS

This application claims the priority of Chinese Patent Application No. 201810530411.X, filed on May 29, 2018, the entire content of which is incorporated herein by reference.

FIELD OF THE DISCLOSURE

The present disclosure relates to the field of organic light-emitting display and, more particularly, relates to an organic light-emitting display panel and an organic light-emitting display device thereof.

BACKGROUND

In recent years, with continuous development of display technology, various types of display devices, such as liquid crystal display devices and organic light-emitting display devices, have emerged within the display industry, and become the mainstream products in the display field. Among these display devices, the organic light-emitting display panel has become the trend in the development of display industry due to its excellent performance including its slim structure, low power consumption, intense brightness, high contrast, high resolution, wide viewing angle, etc., and is a hot research domain in the current display field.

At present, fingerprint unlocking and face unlocking screens are widely accepted by consumers because of their high security and easy operation. The under-screen fingerprint identification is a major trend because it does not occupy an extra area of a screen frame and facilitates achieving a narrow border or borderless design. However, because the under-screen fingerprint identification needs to consider the consequence of light collimation, the current under-screen fingerprint identification is mostly achieved by means of a fingerprint identification module with an add-on collimation system. This structure additionally increases the area of a display panel, which is unfavorable for slimming the display panel. Therefore, researchers in this field are actively exploring the schemes of embedding a fingerprint identification module in a display panel. However, because problems on light collimation, complicated circuits, etc., still have not been solved, the development of embedded fingerprint identification is relatively slow.

Therefore, the technical solutions provided by the present disclosure are trying to solve the above problems and to achieve the function of under-screen fingerprint identification while also obtaining a slim design of the display panel.

BRIEF SUMMARY OF THE DISCLOSURE

In light of the above, the present disclosure provides an organic light-emitting display panel and an organic light-emitting display device, which embed a fingerprint identification unit inside the organic light-emitting display panel to implement the function of under-screen fingerprint identification, and to realize a slim design of the display panel.

One aspect of the present disclosure provides an organic light-emitting display panel. The organic light-emitting display panel includes an array substrate including a plurality of driving elements; a plurality of organic light-emitting components corresponding to the plurality of driving elements; and a plurality of fingerprint identification units, wherein each organic light-emitting component includes an anode and a cathode, and light emitted by the organic light-emitting component emits away from the array substrate, a pixel defining layer is disposed between adjacent organic lighting emitting components, a fingerprint identification unit is disposed at a non-display area between organic light-emitting components and on a side of the pixel defining layer away from the array substrate, and a periphery of the fingerprint identification unit is provided with a light-shielding layer, and the light-shielding layer blocks the fingerprint identification unit from illumination by the light emitted by the organic light-emitting component.

Another aspect of the present disclosure provides an organic light-emitting device. The organic light-emitting device includes an organic light-emitting display panel that comprises an array substrate including a plurality of driving elements; a plurality of organic light-emitting components corresponding to the plurality of driving elements; and a plurality of fingerprint identification units, wherein each organic light-emitting component includes an anode and a cathode, and light emitted by the organic light-emitting component emits away from the array substrate, a pixel defining layer is disposed between adjacent organic lighting emitting components, a fingerprint identification unit is disposed at a non-display area between organic light-emitting components and on a side of the pixel defining layer away from the array substrate, and a periphery of the fingerprint identification unit is provided with a light-shielding layer, and the light-shielding layer blocks the fingerprint identification unit from illumination by the light emitted by the organic light-emitting component.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Figure 1:
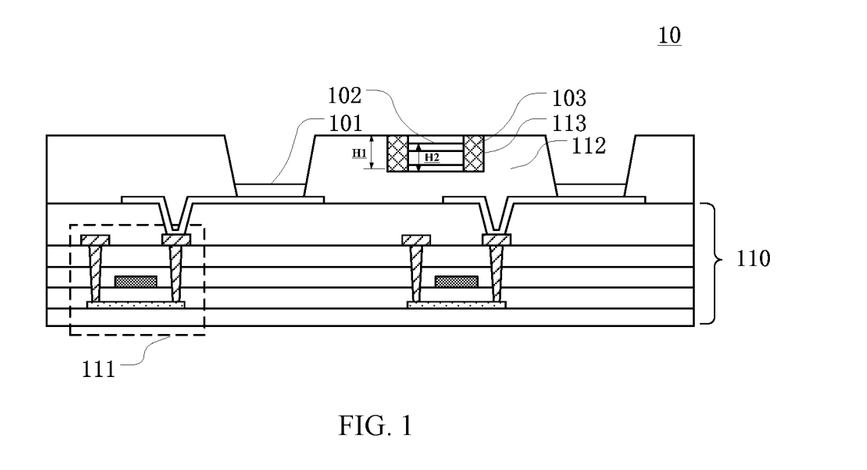
FIG. 1 illustrates a schematic structural diagram of an organic light-emitting display panel consistent with disclosed embodiments.

FIG. 1 illustrates a schematic structural diagram of an organic light-emitting display panel consistent with disclosed embodiments. Referring to FIG. 1, the organic light-emitting display panel 10 includes an array substrate 110, a plurality of driving elements 111 included in the array substrate 110, organic light-emitting components 101 corresponding to the driving elements 111, and a pixel defining layer 112 disposed between adjacent organic light-emitting components 101.

An organic light-emitting component 101 includes an anode and a cathode, and light emitted by the organic light-emitting component 101 emits away from the array substrate 110. The organic light-emitting display panel 10 further includes a plurality of fingerprint identification units 102. A fingerprint identification unit 102 is located in the non-display area between the organic light-emitting components 101, and on the side of the pixel definition layer 112 away from the array substrate 110. The periphery of each fingerprint identification unit 102 is provided with a light-shielding layer 103. The light-shielding layer 103 blocks the fingerprint identification unit 102 from illumination by the light emitted from the organic light-emitting components 101.

It should be noted that, for simplicity purpose, only partial structures of the driving elements are shown in FIG. 1, to illustrate the correspondence between the driving elements and the organic light-emitting components. These structures should be constructed as illustrative rather than restrictive of specific driving elements. Based on the actual needs of an organic light-emitting display panel, the driving elements may include other structures, which will not be described here.

In addition, it should be noted that the fingerprint identification unit in the disclosed embodiment is a photosensitive fingerprint identification unit. The light emitted by an organic light-emitting component is emitted from the light-emitting side of the organic light-emitting display panel. When a user touches the light with a finger, the finger will cause the light to be partially reflected back to the interior of the organic light-emitting display panel. A human's fingerprint includes fingerprint ridges and fingerprint valleys. When the light emitted from the organic light-emitting display panel illuminates the fingerprint ridges, the light will be directly reflected back. However, when the fingerprint valleys are illuminated, since there is no direct contact between the fingerprint valleys and the display device, the light will be refracted and reflected through the air to illuminate the fingerprint valleys, which is then reflected back to the interior of the display panel through the air. Therefore the intensity of the light reflected back by the fingerprint ridges and the intensity of the light reflected back by the fingerprint valleys are different. The photosensitive fingerprint identification unit detects the difference in the intensities of the light, and feeds back the difference as an electrical signal, thereby detecting the fingerprint.

As can be seen from the above, in the organic light-emitting display panel and the organic light-emitting display device provided by the disclosed embodiments, the fingerprint identification unit 102 is disposed on the side of the pixel defining layer 112 away from the array substrate 110, and the periphery of the fingerprint identification unit 102 is provided with a light-shielding layer 103. The light-shielding layer 103 blocks the light emitted by an organic light-emitting component 101 from illuminating the fingerprint identification unit 102, so that the fingerprint identification unit 102 only receives the light that is reflected back to the interior of the organic light-emitting display panel by the finger, which prevents the light interference, and also solves the problem of light collimation at a certain degree, and realizes the slim design of the display panel with the under-screen fingerprint identification.

Figure 2:
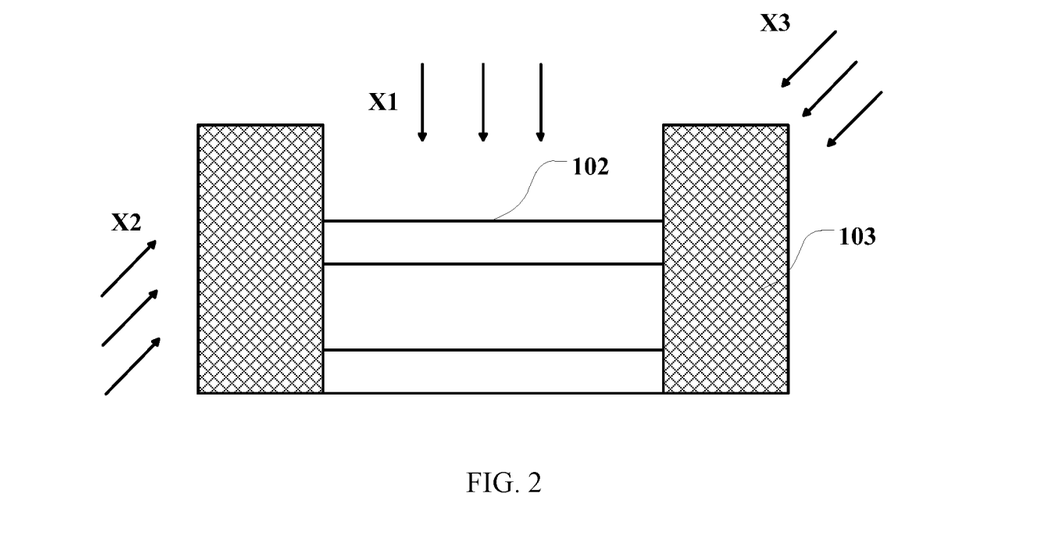
FIG. 2 illustrates a schematic diagram of light received by a fingerprint identification unit consistent with disclosed embodiments.

Optionally, in the disclosed embodiment, as shown in FIG. 1, the height H1 of the light-shielding layer 103 is equal to or greater than the height H2 of the fingerprint identification unit 102 in a direction perpendicular to the surface of the array substrate 110. FIG. 2 illustrates a schematic diagram of light received by a fingerprint identification unit consistent with disclosed embodiments. The fingerprint identification unit 102 needs to receive a light beam X1 illuminated in a direction perpendicular to the surface of the array substrate 110.

On one hand, the light-shielding layer 103 needs to block the fingerprint identification unit 102 from the illumination by the light beam X2 emitted from the organic light-emitting component 101. This requires the height of the light-shielding layer 103 to be equal to or greater than the height of the fingerprint identification unit 102. On the other hand, the light-shielding layer 103 may also block a light beam X3 that is reflected back to the organic light-emitting display panel from an oblique direction and prevent the illumination of the fingerprint identification unit 102 by the light beam X3 that may cause a signal interference and an erroneous result. This then allows the achievement of the collimation of the reflected light. To achieve an ideal collimation effect, the thickness of the light-shielding layer 103 is necessary to be greater than the height of the fingerprint identification unit 102.

Optionally, in the disclosed embodiment, as shown in FIG. 1, the pixel defining layer 112 includes a groove 113, and the fingerprint identification unit 102 is placed in the groove 113 of the pixel defining layer 112. When the array substrate of the organic light-emitting display panel is encapsulated, additional structures, such as a thin-film encapsulation layer or a cover plate, may also be placed on top of the pixel defining layer 112. If a fingerprint identification unit is not placed in the groove, since the fingerprint identification unit 102 has a certain height, a gap may occur, or an obvious slope may form on the thin film in the process of thin-film encapsulation. This will cause a challenge in the encapsulation process and thus influence the performance of encapsulation. Moreover, if not placed in the groove, the fingerprint identification unit 102 may also cause an increased thickness of the display panel, which is unfavorable for slimming the display panel. Therefore, by providing the pixel defining layer 112 with a groove and by placing the fingerprint identification unit 102 inside the groove, no extra space is required by the fingerprint identification unit and the encapsulation process of the display panel is not affected, which facilitates the slimming of the display panel.

Based on the above technical effects, to prevent the fingerprint identification unit 102 from occupying an extra space in the display panel, in one embodiment, the surface of the fingerprint identification unit 102 is set to be even with or lower than the surface of the pixel defining layer 112 on the side away from the array substrate 110. This setting prevents the fingerprint identification unit 102 from protruding beyond the surface of the pixel defining layer 112, thereby facilitating the encapsulation as well as achieving the slimness of the display panel.

Figure 3:
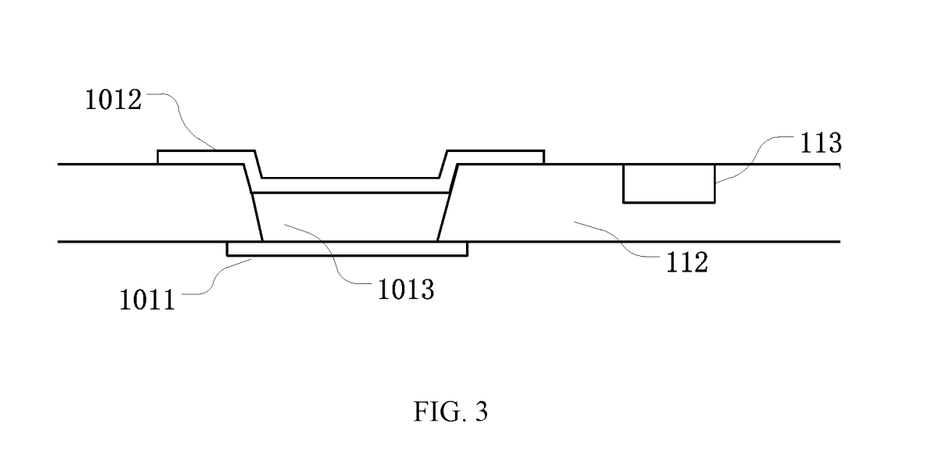
FIG. 3 illustrates a schematic diagram of a sectional view of an organic light-emitting display panel consistent with disclosed embodiments.

FIG. 3 illustrates a schematic diagram of a sectional view of an organic light-emitting display panel consistent with disclosed embodiments. The organic light-emitting component 101 includes an anode 1011, a cathode 1012, and an organic functional layer 1013. The cathode 1012 might not cover the groove 113 of the pixel defining layer 112 in a direction perpendicular to the surface of the array substrate 110. Since the fingerprint identification unit 102 needs to convert an optical signal into an electrical signal under the action of the electric field, the fingerprint identification unit 102 may need to be insulated from the cathode 1012 to ensure that the fingerprint identification unit 102 and the organic light-emitting component 101 both work properly. Accordingly, setting the cathode 1012 to not cover the groove 113 allows the fingerprint identification unit 102 and the cathode 1012 to be sufficiently insulated from each other.

Figure 4:
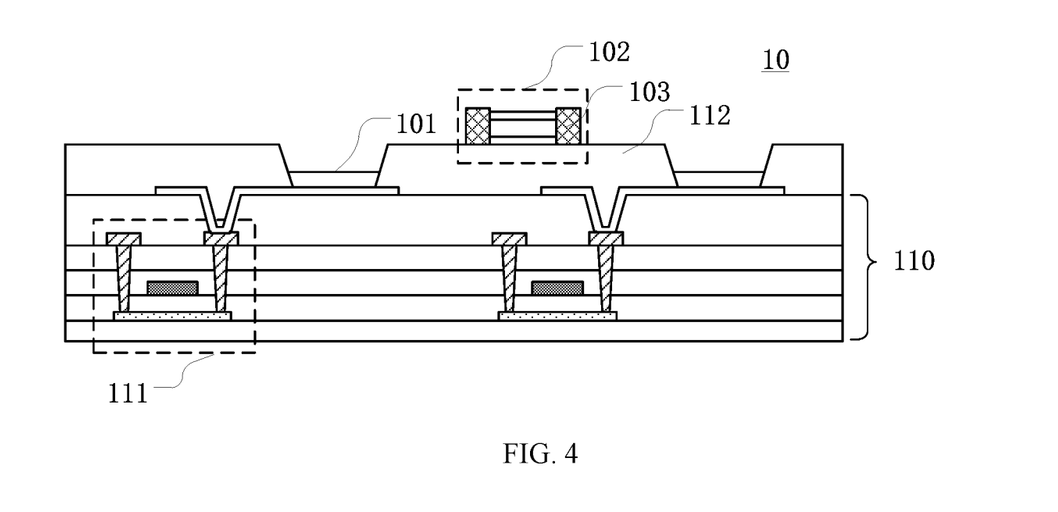
FIG. 4 illustrates a schematic structural diagram of another organic light-emitting display panel consistent with disclosed embodiments.
Figure 5:
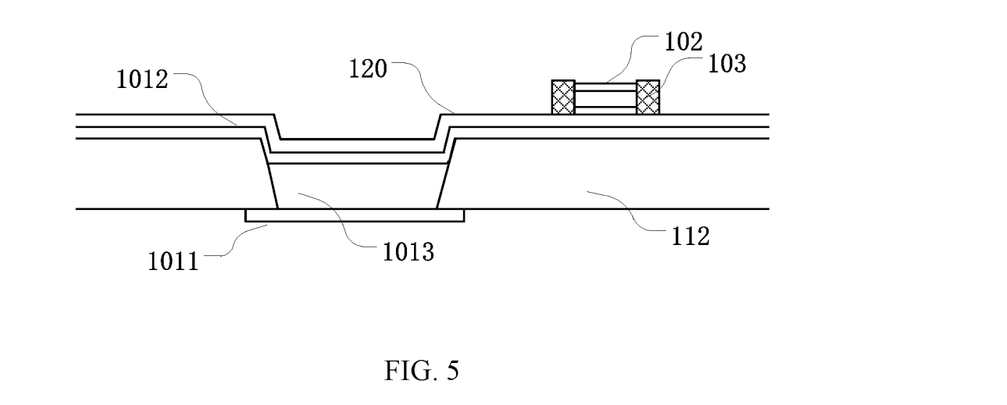
FIG. 5 illustrates a schematic diagram of a sectional view of another organic light-emitting display panel consistent with disclosed embodiments.

FIG. 4 illustrates a schematic structural diagram of another organic light-emitting display panel consistent with disclosed embodiments. Here, other structures for the organic light-emitting display panel in FIG. 4 may be the same as the corresponding structures as shown in FIG. 1, however, the pixel defining layer 112 might not include a groove, and the fingerprint identification unit 102 is placed on top of the pixel defining layer 112. Specifically, FIG. 5 illustrates a schematic diagram of a sectional view of another organic light-emitting display panel consistent with disclosed embodiments. Here, the organic light-emitting display panel 10 further includes a light extraction layer 120. The light extraction layer 120 is disposed on a side of the cathode 1012 away from the pixel defining layer 112, and the fingerprint identification unit 102 is disposed on top of the light extraction layer 120. The light extraction layer 120 may be an organic material with a high refractive index or an inorganic material. Optionally, the light extraction layer 120 may be an insulating material, so that the light extraction layer 120 may insulate the cathode 1012 from the fingerprint identification unit 102 to allow the two parts to work properly.

It should be noted that the fingerprint identification unit 102 described in the above embodiments is placed inside the organic light-emitting display panel 10. The organic light-emitting display panel 10 may be a full-color display structure. That is, the organic light-emitting display panel 10 may include an organic light-emitting component that may emit at least three different colors of light: red, green, and blue, where the emitted light may be combined to form the white light. In this full-color display structure, the organic light-emitting display panel 10 may be directly encapsulated without requiring to add a color resistor.

Figure 6:
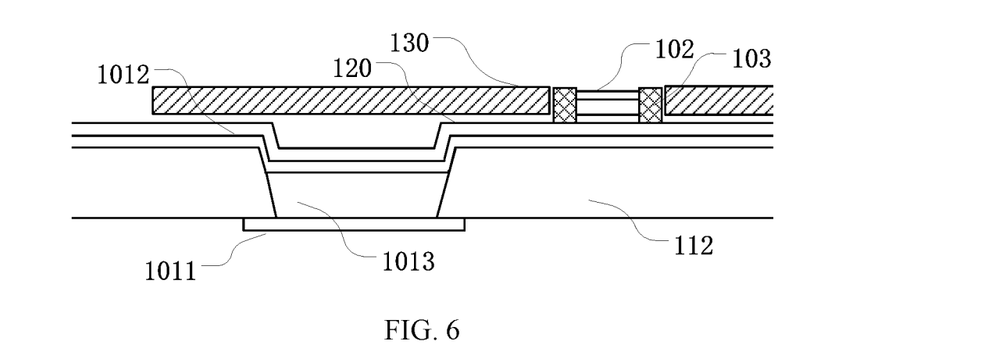
FIG. 6 illustrates a schematic diagram of a sectional view of another organic light-emitting display panel consistent with disclosed embodiments.

Alternatively, the organic light-emitting display panel 10 may also be a white light-emitting display structure. That is, the organic light-emitting display panel 10 includes an organic light-emitting component that emits only white light. In this situation, color resistors need to be placed inside the organic light-emitting display panel 10 to allow a display of different colors. Optionally, FIG. 6 illustrates a schematic diagram of a sectional view of another organic light-emitting display panel consistent with disclosed embodiments. Here, the organic light-emitting display panel 10 further includes color resistors 130 of at least three different colors. A fingerprint identification unit 102 is placed between the adjacent color resistors 130. This setting allows the space between the adjacent color resistors 130 to be used for holding the fingerprint identification unit 102 that has the light-shielding layer 103. On one hand, no extra space is needed to dispose the fingerprint identification unit 102. On the other hand, the use of the light-shielding layer 103 also prevents the occurrence of color blending caused by the light interference between the adjacent color resistors.

Optionally, in the disclosed embodiment, the material of the light-shielding layer 103 may be a light-shielding resin, which may be black or have other colors. The material and/or color of the light-shielding layer 103 are not specifically limited in the present disclosure, as long as it can provide the functions of the light blocking and electrical insulation.

Figure 7:
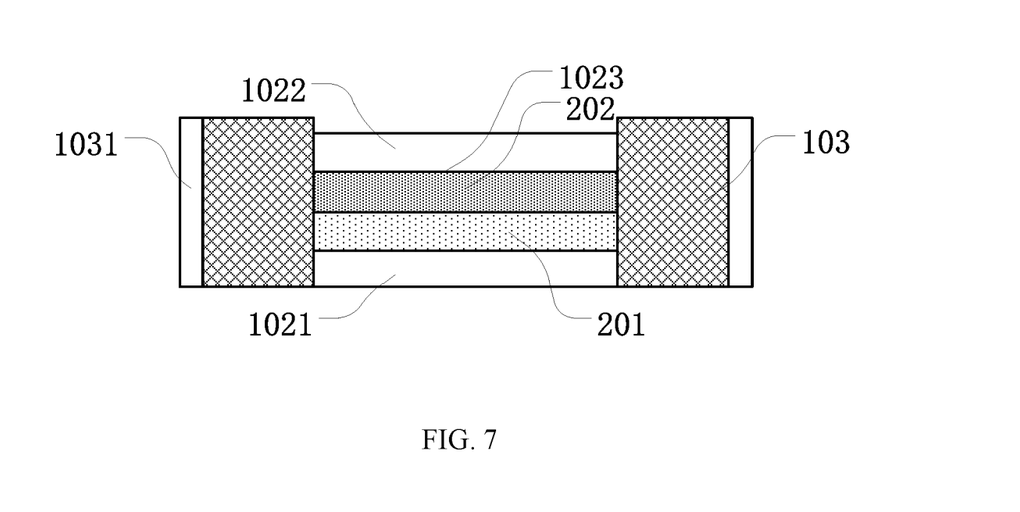
FIG. 7 illustrates a schematic structural diagram of a fingerprint identification unit consistent with disclosed embodiments.

FIG. 7 illustrates a schematic structural diagram of a fingerprint identification unit consistent with disclosed embodiments. Here, a reflective layer 1031 is disposed on the side of the light-shielding layer 103 facing the organic light-emitting component 101. The light-shielding layer 103 is set to prevent the fingerprint identification unit 102 from illumination by the light emitted from the organic light-emitting component. By providing an additional reflective layer 1031 on the side of the light-shielding layer 103 facing the organic light-emitting component, light hitting the light-shielding layer 103 may be reflected back to the organic light-emitting component for reuse, thereby increasing the light-emitting efficiency of the organic light-emitting component. Optionally, the material of the reflective layer 1031 may be a metal material, such as aluminum, magnesium, or silver, a fluorescent material, or other materials that can reflect the light, which the present disclosure is not intended to limit.

It should be noted that, in the disclosed embodiment, the fingerprint identification units 102 may be distributed in the display panel in a manner that each fingerprint identification unit 102 is disposed between a few of adjacent sub-pixels. For example, a fingerprint identification unit 102 may be disposed between every five or ten sub-pixels. The specific manner for disposing the fingerprint identification unit 102 may be determined based on the size of a fingerprint area of the display panel, a specific structure of the display panel, and the accuracy requirement for fingerprint identification, which the present disclosure is not intended to limit, either.

Further, in the disclosed embodiment, as described above, the fingerprint identification unit 102 is a photosensitive fingerprint identification unit. The fingerprint identification unit 102 detects a human's fingerprint by collecting the light information reflected by the fingerprint and converting the collected information into an electrical signal. Specifically, as illustrated in FIG. 7, the fingerprint identification unit 102 includes a first electrode 1021 and a second electrode 1022 disposed opposite to each other. The first electrode 1021 is disposed adjacent to the array substrate 110. The first electrode 1021 is an opaque electrode. Since the first electrode 1021 is close to the array substrate 110, the light emitted by the organic light-emitting component 101 may illuminate the first electrode 1021. By setting the first electrode 1021 to be an opaque electrode, the fingerprint identification unit 102 may be further protected from the interference of the light emitted from the organic light-emitting component 101.

It should be noted that, in the disclosed embodiment, the first electrodes 1021 of the fingerprint identification units 102 are connected with each other, and the second electrodes 1022 of the fingerprint identification units 102 are also connected with each other. The organic light-emitting display panel 10 further includes an integrated chip. The integrated chip supplies the voltage to the first electrodes 1021 and the second electrodes 1022. The integrated chip is also responsible for providing signals to other circuits of the organic light-emitting display panel 10, which will not be described in detail here.

As shown in FIG. 7, in the disclosed embodiment, the fingerprint identification unit 102 also includes a photoelectric conversion unit 1023 between the first electrode 1021 and the second electrode 1022. The photoelectric conversion unit 1023 absorbs the light reflected back to the interior of the organic light-emitting display panel 10 by the fingerprint, and converts the optical signal into an electronic signal.

With respect to the structure of the above-described fingerprint identification unit 102, optionally, the first electrode 1021 may be a three-layer structure of ITO/Ag/ITO, where the ITO is indium tin oxide. In some embodiments, the ITO may also be other metal or metal oxide, which the present disclosure is not intended to limit. The second electrode 1022 may be a silver or a magnesium-silver alloy, or other materials that have good conductivity, which the present disclosure is not intended to limit, either.

Optionally, as shown in FIG. 7, the photoelectric conversion unit 1023 includes a stacked structure comprising a P-type material layer 201 and an N-type material layer 202. The P-type material layer 201 is adjacent to the first electrode 1021, and the N-type material layer is adjacent to the second electrode 1022. A PN junction is formed between the P-type material layer 201 and the N-type material layer 202. The P-type material layer 201 connects with the first electrode 1021, and is responsible for transmitting the holes injected by the first electrode 1021. The N-type material layer 202 connects with the second electrode 1022, and is responsible for transmitting the electrons injected by the second electrode 1022. The electrons and holes meet at the interface of the PN junction, and mutually diffuse to form an intermediate electric field layer. Under the action of an externally applied electric field, the PN junction may be turned on and off to implement the transmission and shutdown of an electrical signal, based on the change of the directions of the intermediate electric field layer and the applied electric field.

In the disclosed embodiment, both the P-type material of the P-type material layer and the N-type material of the N-type material layer may be inorganic semiconductor materials. Specifically, the P-type material may be copper indium gallium selenide or P-type cadmium telluride. The N-type material may be cadmium sulfide, N-type cadmium telluride, zinc oxide, etc. In some embodiments, the P-type material and the N-type material may also be other inorganic semiconductor materials, which the present disclosure is not intended to limit.

Further, in the disclosed embodiment, the P-type material and the N-type material may also be organic semiconductor materials. Specifically, the P-type material may be a metal complex of copper phthalocyanine or polyurethane, and the N-type material may be a fullerene C60 or the like. In some embodiments, the P-type material and the N-type material may also be other organic semiconductor materials, which the present disclosure is not intended to limit.

Figure 8:
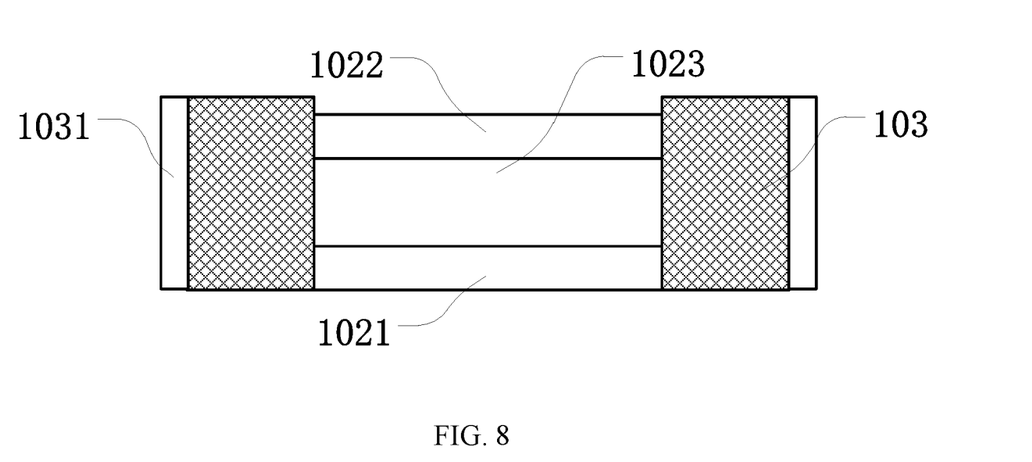
FIG. 8 illustrates a schematic structural diagram of another fingerprint identification unit consistent with disclosed embodiments.

Optionally, FIG. 8 illustrates a schematic structural diagram of another fingerprint identification unit consistent with disclosed embodiments. Here, the photoelectric conversion layer 1023 may be a single layer structure. The material of this layer may have the properties of both the P-type material and the N-type material. That is, given an electric field with a certain direction and a certain intensity, this material may simultaneously implement the bidirectional transition of electrons and holes, thereby turning on the electrical signal transmission. Under the electric field with the opposite direction, the materials may turn off the transmission of the electrical signals. Specifically, the material of this layer may include a polyparaphenylene (p-phenylene vinylene, PPV) group, a fullerene group, or another material that has the properties of both the P-type material and the N-type material, which the present disclosure is not intended to limit.

Figure 9:
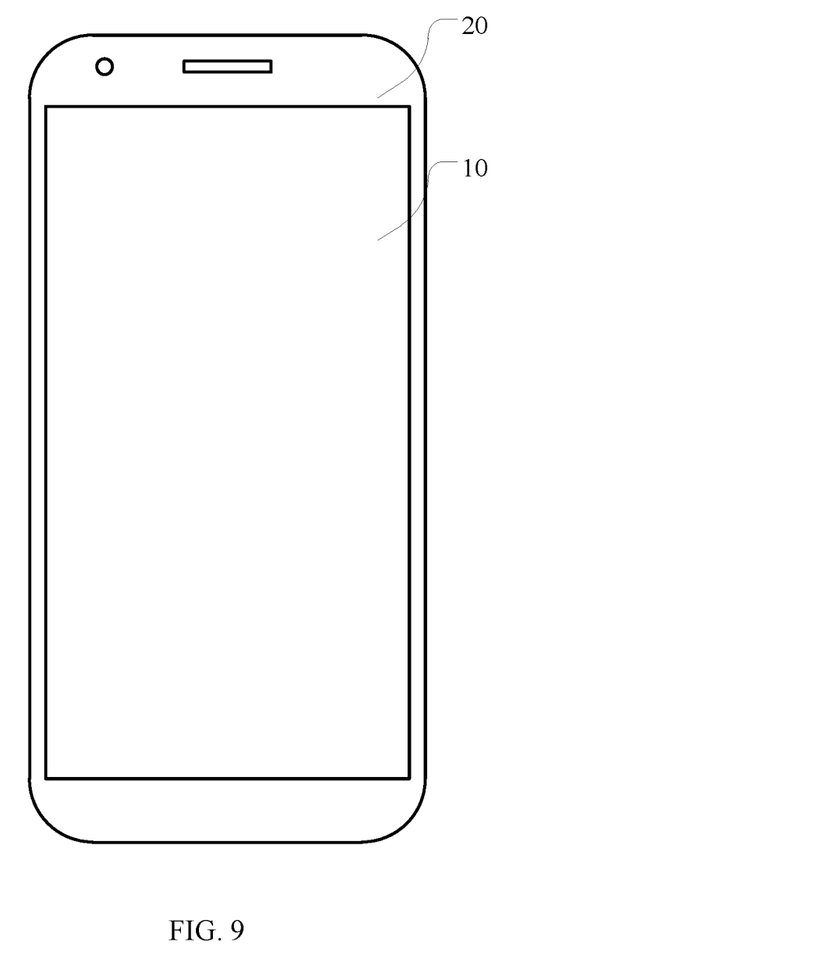
FIG. 9 illustrates a schematic structural diagram of an organic light-emitting display device consistent with disclosed embodiments.

In another aspect, the present disclosure further provides an organic light-emitting display device that includes any of the display panels consistent with the disclosed embodiments. Referring to FIG. 9, a schematic diagram of an organic light-emitting display device consistent with disclosed embodiments is provided. Here, the organic light-emitting display device 20 includes an organic light-emitting display panel 10 for displaying a signal generated by the organic light-emitting display device 20. The display panel 10 may be any of the display panels consistent with the above-disclosed embodiments. The organic light-emitting display device may be a television, a notebook computer, a mobile phone, a smart wearable display, a watch, or any other display device, which the present disclosure is not intended to limit.

As can be seen from the above, in the organic light-emitting display panel and the organic light-emitting display device provided by the present disclosure, a fingerprint identification unit 102 is disposed on the side of the pixel defining layer 112 of the organic light-emitting display panel 10 away from the array substrate 110. The periphery of the fingerprint identification unit 102 is provided with a light-shielding layer 103. An opaque first electrode 1021 is disposed on the side of the fingerprint identification unit 102 facing the organic light-emitting component 101. With this structure, the light emitted by the organic light-emitting component 101 is blocked by the light-shielding layer 103 and the opaque first electrode 1021, and thus can hardly get into the fingerprint identification unit 102. The fingerprint identification unit 102 receives the light reflected back by a fingerprint. Additionally, by setting the light-shielding layer 103 to a certain height, the light-shielding layer 103 may block the light reflected back to the fingerprint identification unit 102 from the oblique direction, to allow an achievement of a certain degree of light collimation. An accurate optical signal and subsequently accurate fingerprint information may then be received by the fingerprint identification unit 102. This improves the accuracy of the under-screen fingerprint identification while also obtains a slim design of the display panel with the under-screen fingerprint identification.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above-described embodiments, the present disclosure is not limited to the above-described embodiments, but may be embodied in other equivalent forms without departing from the scope of the present disclosure, which is determined by the appended claims.

What is claimed is:

1. An organic light-emitting display panel, comprising:
   an array substrate including a plurality of driving elements;
   a plurality of organic light-emitting components corresponding to the plurality of driving elements; and
   a plurality of fingerprint identification units,
   wherein:
   each organic light-emitting component includes an anode and a cathode, and light emitted by the organic light-emitting component emits away from the array substrate,
   a pixel defining layer is disposed between adjacent organic lighting emitting components,
   a fingerprint identification unit is disposed at a non-display area between organic light-emitting components and on a side of the pixel defining layer away from the array substrate, and
   a periphery of the fingerprint identification unit is provided with a light-shielding layer having a height equaling to or greater than a height of the fingerprint identification unit in a direction perpendicular to a surface of the array substrate, and the light-shielding layer blocks the fingerprint identification unit from illumination by the light emitted by the organic light-emitting component.

2. The organic light-emitting display panel according to claim 1, wherein the pixel defining layer includes a groove, and the fingerprint identification unit is placed in the groove of the pixel defining layer.

3. The organic light-emitting display panel according to claim 2, wherein a surface of the fingerprint identification unit away from the array substrate is set to be even with or lower than a surface of the pixel defining layer away from the array substrate.

4. The organic light-emitting display panel according to claim 2, wherein the cathode does not cover the groove of the pixel defining layer in a direction perpendicular to a surface of the array substrate.

5. The organic light-emitting display panel according to claim 1, further comprising a light extraction layer, wherein the light extraction layer is disposed on a side of the cathode away from the pixel defining layer, and the fingerprint identification unit is disposed on the light extraction layer.

6. The organic light-emitting display panel according to claim 1, further comprising color resistors of at least three different colors, wherein the fingerprint identification unit is disposed between adjacent color resistors.

7. The organic light-emitting display panel according to claim 1, wherein a material of the light-shielding layer is a light-shielding resin.

8. The organic light-emitting display panel according to claim 1, wherein the fingerprint identification unit includes a first electrode and a second electrode disposed opposite to each other, the first electrode is located on a side of the second electrode adjacent to the array substrate, and the first electrode is an opaque electrode.

9. The organic light-emitting display panel according to claim 8, further comprising an integrated chip that supplies a voltage to the first electrode and the second electrode, wherein first electrodes of each of the plurality of fingerprint identification units are connected to each other, and second electrodes of each of the plurality of fingerprint identification units are also connected to each other.

10. The organic light-emitting display panel according to claim 8, wherein the fingerprint identification unit further comprises a photoelectric conversion unit between the first electrode and the second electrode.

11. The organic light-emitting display panel according to claim 10, wherein the photoelectric conversion unit comprises a stacked structure comprising a P-type material layer and an N-type material layer, the P-type material layer is adjacent to the first electrode, and the N-type material layer is adjacent to the second electrode.

12. The organic light-emitting display panel according to claim 11, wherein the P-type material and the N-type material are inorganic semiconductor materials, the P-type material is one of copper indium gallium selenide and P-type cadmium telluride, and the N-type material is one of cadmium sulfide, N-type cadmium telluride, and zinc oxide.

13. The organic light-emitting display panel according to claim 11, wherein the P-type material and the N-type material are organic semiconductor materials, the P-type material is one of a metal complex of copper phthalocyanine and a metal complex of polyurethane, and the N-type material is fullerene.

14. The organic light-emitting display panel according to claim 10, wherein the photoelectric conversion unit includes a polyparaphenylene group or a fullerene group.

15. An organic light-emitting display device, comprising:
   an organic light-emitting display panel for displaying the signal, wherein the organic light-emitting display panel includes:
   an array substrate including a plurality of driving elements;
   a plurality of organic light-emitting components corresponding to the plurality of driving elements; and
   a plurality of fingerprint identification units, wherein:
   each organic light-emitting component includes an anode and a cathode, and light emitted by the organic light-emitting component emits away from the array substrate,
   a pixel defining layer is disposed between adjacent organic lighting emitting components, and the pixel defining layer includes a groove,
   a fingerprint identification unit is disposed at a non-display area between organic light-emitting components and is placed in the groove of the pixel defining layer on a side of the pixel defining layer away from the array substrate, and
   a periphery of the fingerprint identification unit is provided with a light-shielding layer, and the light-shielding layer blocks the fingerprint identification unit from illumination by the light emitted by the organic light-emitting component.

16. The organic light-emitting display device according to claim 15, wherein a height of the light-shielding layer is equal to or greater than a height of the fingerprint identification unit in a direction perpendicular to a surface of the array substrate.

17. An organic light-emitting display panel, comprising:
   an array substrate including a plurality of driving elements;
   a plurality of organic light-emitting components corresponding to the plurality of driving elements; and
   a plurality of fingerprint identification units,
   wherein:
   each organic light-emitting component includes an anode and a cathode, and light emitted by the organic light-emitting component emits away from the array substrate,
   a pixel defining layer is disposed between adjacent organic lighting emitting components,
   a fingerprint identification unit is disposed at a non-display area between organic light-emitting components and on a side of the pixel defining layer away from the array substrate,
   a periphery of the fingerprint identification unit is provided with a light-shielding layer, and the light-shielding layer blocks the fingerprint identification unit from illumination by the light emitted by the organic light-emitting component, and
   a reflective layer is disposed on a side of the light-shielding layer facing one of a plurality of organic light-emitting components.

18. The organic light-emitting display panel according to claim 17, wherein the reflective layer includes one of a metal material and a fluorescent material.

* * * * *